United States Patent
Kim et al.

(10) Patent No.: US 7,633,097 B2
(45) Date of Patent: Dec. 15, 2009

(54) GROWTH OF III-NITRIDE LIGHT EMITTING DEVICES ON TEXTURED SUBSTRATES

(75) Inventors: Andrew Y. Kim, San Jose, CA (US); Steven A. Maranowski, San Jose, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 129 days.

(21) Appl. No.: 10/950,000

(22) Filed: Sep. 23, 2004

(65) Prior Publication Data
US 2006/0060888 A1    Mar. 23, 2006

(51) Int. Cl.
*H01L 31/109* (2006.01)
(52) U.S. Cl. .................................. 257/200
(58) Field of Classification Search ............... 257/200, 257/94, 101–103, 79, 80, 82, 85, 86, 87, 257/88, 90, 96, 97, 98, 104, E33.028, 183, 257/189, 196, 201, 289, 613; 428/698; 438/22, 438/24, 46, 47, 979
See application file for complete search history.

(56) References Cited

U.S. PATENT DOCUMENTS

| | | | |
|---|---|---|---|
| 5,927,995 A | 7/1999 | Chen et al. | |
| 6,091,085 A | 7/2000 | Lester | |
| 6,133,589 A * | 10/2000 | Krames et al. | 257/103 |
| 6,153,010 A | 11/2000 | Kiyoku et al. | |
| 6,265,289 B1 | 7/2001 | Zheleva et al. | |
| 6,333,522 B1 * | 12/2001 | Inoue et al. | 257/99 |
| 6,534,791 B1 | 3/2003 | Hayashi et al. | |
| 6,537,513 B1 | 3/2003 | Armano et al. | |
| 6,630,692 B2 * | 10/2003 | Goetz et al. | 257/94 |
| 6,844,569 B1 * | 1/2005 | Lee et al. | 257/79 |
| 2003/0057444 A1 * | 3/2003 | Niki et al. | 257/200 |
| 2003/0180580 A1 * | 9/2003 | Wada et al. | 428/698 |
| 2004/0245543 A1 * | 12/2004 | Yoo | 257/103 |

OTHER PUBLICATIONS

Satoru Tanaka et al., "Anti-Surfactant in III-Nitride Epitaxy" -Quantum Dot Formation and Dislocation Termination-, Jpn. J. Appl.Phys., vol. 39 (2000) Pt. 2, No. 8B, Express Letter, pp. L831-L834.

* cited by examiner

*Primary Examiner*—Dao H Nguyen
*Assistant Examiner*—Tram H Nguyen
(74) *Attorney, Agent, or Firm*—Patent Law Group; Rachel V. Leiterman

(57) ABSTRACT

A III-nitride light emitting device is grown on a textured substrate, in order to reduce the amount of total internal reflection at the interface between the substrate and the III-nitride layers. In some embodiments, the device includes a first growth region substantially free of voids, and a second growth region that improves the material quality such that high quality layers can be grown over the first and second regions.

25 Claims, 4 Drawing Sheets

GROWTH OF III-NITRIDE LIGHT EMITTING DEVICES ON TEXTURED SUBSTRATES

BACKGROUND

1. Field of Invention

The present invention relates to the growth of III-nitride light emitting devices.

2. Description of Related Art

Semiconductor light-emitting diodes (LEDs) are among the most efficient light sources currently available. Materials systems currently of interest in the manufacture of high-brightness LEDs capable of operation across the visible spectrum include Group III-V compound semiconductors, particularly binary, ternary, and quaternary alloys of gallium, aluminum, indium, and nitrogen, also referred to as III-nitride materials. Such devices typically have a light emitting or active region sandwiched between a p-doped region and an n-doped region. The active region may be a single light emitting layer or multiple quantum well layers separated by barrier layers. Often III-nitride devices are epitaxially grown on sapphire, silicon carbide, or III-nitride substrates by metal organic chemical vapor deposition (MOCVD), molecular beam epitaxy (MBE), or other epitaxial techniques. Devices grown on a conductive substrate often have the contacts formed on opposite sides of the substrate. Alternatively, the device may be etched to expose portions of both the n- and p-type regions on the same side of the substrate in devices grown on poorly conducting substrates, or for optical or electrical reasons. The contacts are then formed on the exposed regions. If the contacts are reflective and light is extracted from the side of the device opposite the contacts, the device is referred to as a flip chip. III-nitride LEDs structures are often grown on sapphire substrates due to sapphire's high temperature stability and relative ease of production.

The use of a sapphire substrate may lead to poor extraction efficiency due to the large difference in index of refraction at the interface between the semiconductor layers and the substrate. When light is incident on an interface between two materials, the difference in index of refraction determines how much light is reflected at that interface, and how much light is transmitted through it. The larger the difference in index of refraction, the more light is reflected. The refractive index of sapphire (1.8) is low compared to the refractive index of the III-nitride device layers (2.4) grown on the sapphire. Thus, a large portion of the light generated in the III-nitride device layers is reflected when it reaches the interface between the semiconductor layers and a sapphire substrate. The reflected light is waveguided and makes many passes through the device before it is extracted. These many passes result in significant attenuation of the light due to optical losses at contacts, free carrier absorption, and interband absorption within any of the III-nitride device layers.

SUMMARY

In accordance with embodiments of the invention, a III-nitride light emitting device is grown on a textured substrate, in order to reduce the amount of total internal reflection at the interface between the substrate and the III-nitride layers. In some embodiments, the device includes a first growth region substantially free of voids, and a second growth region that improves the material quality such that high quality layers can be grown over the first and second regions.

DETAILED DESCRIPTION

Figure 3A:
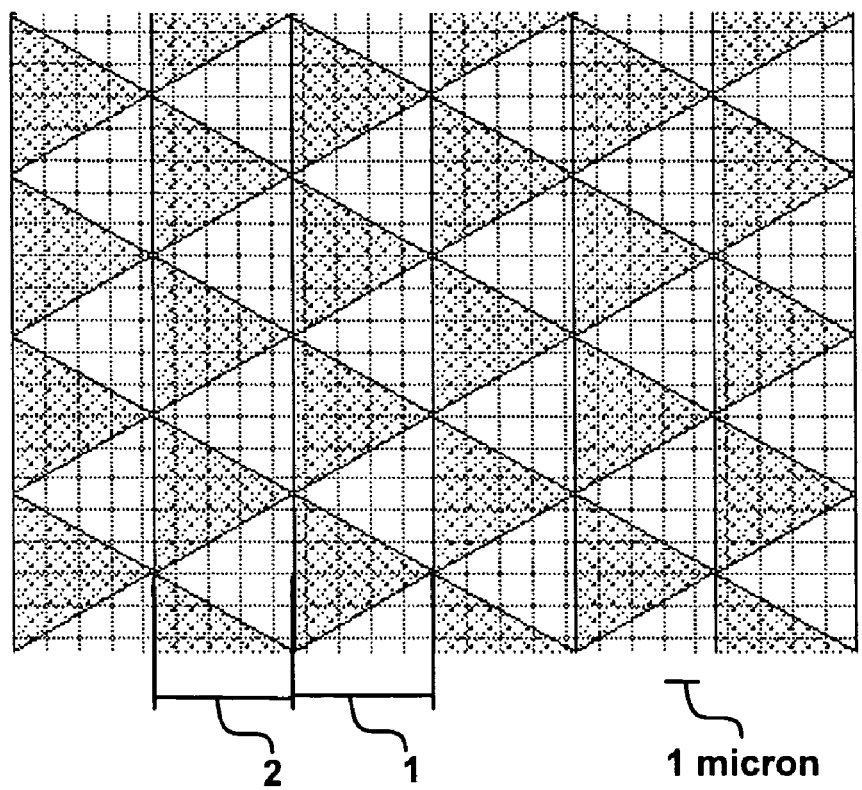
FIG. 3A illustrates an example of a pattern formed on the surface of substrate 40 of FIG. 1.

Total internal reflection at the interface between a sapphire or other suitable substrate and the III-nitride device layers may be reduced by texturing or patterning the substrate. As used herein, "textured" refers to a substrate surface that is not smooth, either due to random roughening of the surface or due to forming a pattern of repeating features on the surface. For economy of language, many of the examples below refer to patterned substrate surfaces. It is to be understood that the same principles may be applied to devices with randomly roughened substrate surfaces. A patterned substrate generally has a thickness that varies with the pattern. As used herein, a "feature" on a patterned substrate refers to the parts of the pattern where the substrate is thicker than the minimum substrate thickness. For example, if a pattern on a substrate includes triangular regions where the substrate is thick interposed by triangular regions where the substrate is thinner, as illustrated in FIG. 3A, the "features" are the thick triangular regions.

Growth of high quality III-nitride device layers on patterned substrates can be difficult. One technique for growing high quality III-nitride layers on patterned substrates or patterned buffer layers is epitaxial lateral overgrowth, described in, for example, U.S. Pat. No. 6,265,289 to Zheleva et al., titled "Methods of Fabricating Gallium Nitride Semiconductor Layers By Lateral Growth From Sidewalls Into Trenches, and Gallium Nitride Semiconductor Structures Fabricated Thereby." Epitaxial lateral overgrowth techniques grow III-nitride layers laterally from patterned regions formed either on the substrate or on a III-nitride buffer layer formed over the growth substrate. The patterned regions are typically etched mesas, where lateral growth primarily originates on top of the mesas, or windows etched through a mask layer, where growth primarily originates inside the windows. While epitaxial lateral overgrowth may result in high quality material, a major disadvantage is that lateral growth conditions often results in voids filled with air in the trenches beneath the laterally grown material. Since air has a low index of refraction compared to both III-nitride materials and sapphire, the voids can cause total internal reflection, potentially reducing the amount of light extracted from the device. In addition, the patterns used to facilitate epitaxial lateral overgrowth, either mesas or windows etched through a mask layer, are generally not optimized to improve light extraction from the device.

When III-nitride layers are grown under conditions that favor filling in the features on a patterned substrate, the resulting III-nitride crystal layers may be rough, have a small grain size, and/or have a high density of defects, due to the collision of grains originating on different features of the patterned substrate. Surface roughness, small grain size, and the presence of defects in the layers of a semiconductor light emitting device may degrade the internal light-generating efficiency of the device, potentially destroying any benefit created by patterning the substrate. Defects are also generally distributed inhomogeneously and concentrated near the edge of patterned features or where growth from adjacent features collide, which can create electrical leakage problems in large area devices such as light-emitting diodes.

In accordance with embodiments of the invention, III-nitride crystal growth on a textured or patterned substrate occurs in multiple phases. In the first phase, the growth conditions favor formation of a layer that conforms to the substrate without voids and has a planar and smooth surface. In the second phase, the defects in the growth resulting from the first phase are interrupted and the material quality is improved. Additional layers are then grown under growth conditions that favor formation of material with a quality suitable for the electrically- and optically-active layers in a semiconductor light emitting device. The pattern on the substrate is chosen to facilitate void-free filling of the pattern, and to improve light extraction. Though the examples below describe two growth phases, in some embodiments additional growth phases similar to the first or second growth phases described below may follow the first and second growth phases, in order to attain the desired material quality.

Figure 1:
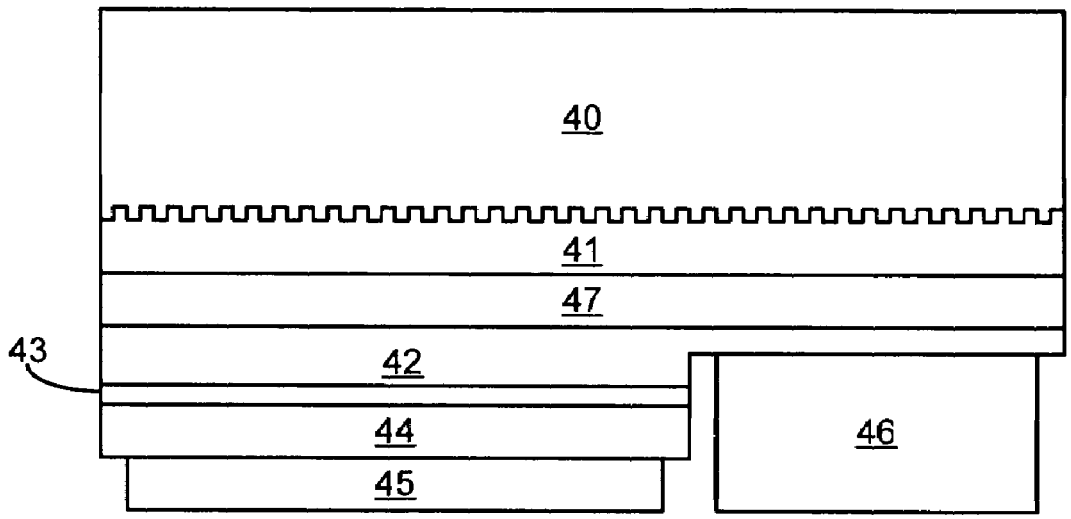
FIG. 1 illustrates a III-nitride light emitting device according to embodiments of the invention.

FIG. 1 illustrates a device according to embodiments of the invention. A first growth region 41 is grown over a textured or patterned substrate 40. Suitable substrates include, for example, sapphire and SiC. A second growth region 47 is grown over first growth region 41. Device layers, including an n-type region 42, an active region 43, and a p-type region 44 are then grown over the second growth region 47. A portion of p-type region 44 and active region 43 is etched away to expose a portion of n-type region 42. An n-contact 46 is formed on the exposed portion of n-type region 42 and a p-contact 45 is formed on the remaining portion of p-type region 44. Contacts 45 and 46 are often reflective. The device is mounted on a submount or other structure with the contacts down, such that light is extracted from the device through substrate 40.

Figure 2:
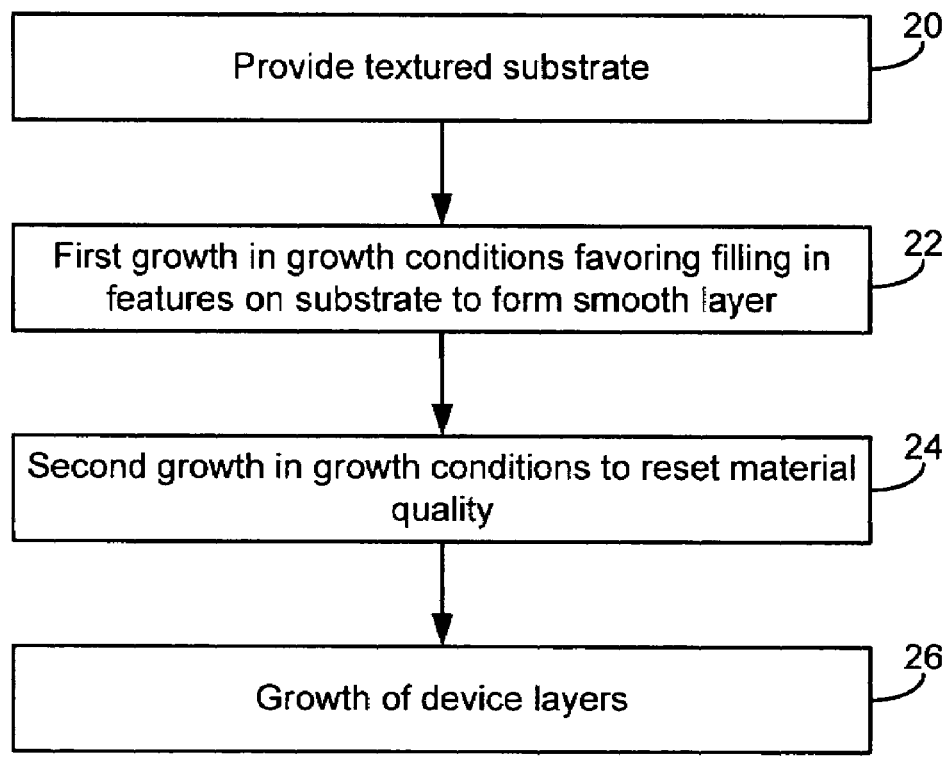
FIG. 2 illustrates a method of forming the device of FIG. 1.
Figure 3B:
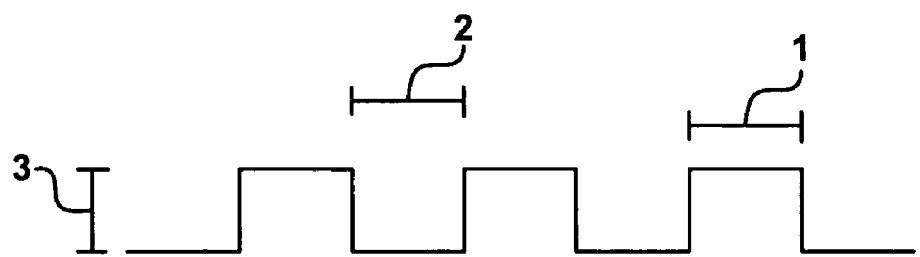
FIG. 3B is a cross section of a portion of substrate 40.

FIG. 2 illustrates a method of forming the device illustrated in FIG. 1. In step 20, a textured or patterned substrate 40 is provided. Though the texturing on substrate 40 may be random, generally the texturing is a repeating pattern. FIG. 3A illustrates an example of a suitable pattern. In the pattern illustrated in FIG. 3A, triangular raised regions 1 are separated by triangular sunken regions 2. The grid illustrated in FIG. 3A corresponds to one micron. The pattern may be formed by, for example, conventional masking and etching steps, such as wet or dry etching or ion milling. FIG. 3B illustrates a cross section of a portion of a suitable substrate, such as the substrate illustrated in FIG. 3A. The features in the pattern often have a length 1 of about 5 microns, and may have a length between about 1 micron and about 10 microns. The features often have a spacing 2 of at least 1 micron. The features often have a height 3 of about 0.4 micron, and may have a height between about 0.1 micron and about 1 microns.

In step 22, first growth region 41 is grown, under conditions that favor filling in the features in the pattern on the growth substrate to form a smooth layer. First growth region 41 generally includes a region of rough growth (for example, three dimensional growth of grains in a cross section having peaks and valleys) that fills in the patterns on the growth substrate, followed by a region of smooth growth (for example, two dimensional growth). For example, first growth region 41 may include a rough growth region between 0.1 and 1 micron thick with an RMS roughness of 50 to 175 nm. A usual thickness for the rough growth region is about 0.7 micron, with an RMS roughness of about 100 nm. The rough growth region is followed by a smooth region with an RMS roughness of less than 20 nm. A usual RMS roughness for the smooth region is about 5 nm. First growth region 41 may be formed at relatively high pressure, high temperature, and high $H_2:NH_3$ ratio, in order to form a smooth, void-free layer. First growth region 41 may have a high density of defects, for example between about $10^9$ cm$^{-2}$ and $10^{10}$ cm$^{-2}$. In some embodiments, growth of the second growth region or subsequent layers eliminates defects present during the growth of the first growth region, such that first growth region 41 does not have a substantially higher defect density than other regions in the device. The minimum thickness of first growth region 41 is the height of the pattern features on substrate 40 or about 0.5 microns, whichever is larger. First growth region 41 often has a thickness of about 1.5 micron. Examples of suitable first growth regions that include a rough growth region followed by a smooth growth region include defect reduction layers with or without optional coalescence layers, and nucleation layers with or without optional coalescence layers, as described in U.S. Pat. No. 6,630,692, which is incorporated herein by reference, and as described below.

After first growth region 41, the material quality is improved by a second growth region 47 that reduces or eliminates defects in first growth region 41, or at least partially prevents the defects in first growth region 41 from propagating into device regions 42, 43, and 44. Second growth region 47 may have a defect density less than first growth region 41. Like first growth region 41, second growth region 47 may include a region of rough growth that improves the material quality in the device, followed by a region of smooth growth that provides a surface suitable for growing subsequent layers in the device. For example, like first growth region 41, second growth region 47 may include a rough growth region between 0.1 and 1 micron thick with an RMS roughness of 50 to 175 nm. A usual thickness for the rough growth region is about 0.7 micron, with an RMS roughness of about 100 nm. The rough growth region is followed by a smooth region with an RMS roughness of less than 20 nm. A usual RMS roughness for the smooth region is about 5 nm. Examples of suitable material quality-improving second growth regions 47 include Si-dosed layers, defect reduction layers with or without optional coalescence layers, and nucleation layers with or without optional coalescence layers, as described in U.S. Pat. No. 6,630,692.

After second growth region 47, n-type region 42, active region 43, and p-type region 44 are grown. A mesa is etched and contacts 45 and 46 are formed.

The semiconductor layers in the embodiments described herein may be grown by MOCVD in a conventional unidirectional flow MOCVD reactor using trimethylgallium (TMG) or triethylgallium (TEG) as a gallium source, trimethylaluminum (TMAl) as an aluminum source, trimethylindium (TMIn) as an indium source, ammonia ($NH_3$) as a nitrogen source, silane ($SiH_4$) as a silicon source, and hydrogen ($H_2$) or nitrogen ($N_2$) as a carrier gas. Other MOCVD reactors, other source and carrier gases, and other growth methods, such as molecular beam epitaxy (MBE) or hydride vapor phase epitaxy (HVPE), for example, may also be used.

In some embodiments, one or more low-temperature GaN nucleation layers grown on substrate 40 to coat the pattern on substrate 40. The low temperature nucleation layer is, for example, grown to a thickness of about 20 nm to about 50 nm, typically about 25 nm, and is grown at a temperature of about 500° C. to about 600° C., typically about 550° C. Although in this embodiment the low-temperature nucleation layer is GaN, in other implementations other III-nitride materials may be used. Such nucleation layers are described in M. Iwaya et al., Japanese Journal of Applied Physics 37, 316 (1998), incorporated herein by reference in its entirety.

In some embodiments, first growth region 41 includes a defect reduction layer. The defect reduction layer fills in the pattern on substrate 40 with generally three dimensional, rough growth. The defect reduction layer is grown on substrate 40 at a temperature of about 900° C. to about 1175° C., typically about 1125° C. The ratios of partial pressures $NH_3$/TMG and $NH_3$/$H_2$ (more generally, V/III and V/$H_2$, where V and III designate elements from groups V and III of the periodic table) during growth of the defect reduction layer are low compared to those required to maintain a smooth growth surface morphology, as in device layers 42, 43, and 44. Ranges and typical values for these partial pressure ratios during growth of a GaN defect reduction layer are tabulated in row (a) of table 1 below. The defect reduction layer is grown under these conditions to a thickness of about 0.1 μm to about 15 μm, typically about 0.5 to 1 μm. The flow of TMG may then be stopped and the defect reduction layer may be exposed to the continuing hydrogen and ammonia flows for about 1 second to about 1000 seconds, typically about one minute. The $H_2$ and $NH_3$ ambient etches the surface of defect reduction layer 20. These growth and etching conditions promote the formation of a rough surface including individual independent GaN grains or islands typically having a diameter of about 0.1 μm to about 1 μm.

It is desirable for the III-nitride material to coalesce into a smooth layer after growth of the rough defect reduction layer. In some embodiments, the defect reduction layer exhibits natural coalescence behavior after rough growth. In some embodiment, an optional GaN coalescence layer may be grown on the defect reduction layer at a temperature of about 950° C. to about 1200° C., typically about 1160° C. The growth temperature and the ratio of partial pressures $NH_3$/TMG and $NH_3$/$H_2$ are selected to promote rapid lateral (parallel to the substrate surface) growth and to lead to coalescence of the GaN grains and formation of a smooth epitaxial growth surface. Ranges and typical values for these partial pressure ratios during growth of a GaN coalescence layer are tabulated in row (b) of table 1 below. The coalescence layer has a thickness of, for example, about 0.5 μm to about 20 μm, typically about 0.5 to 1.5 μm. The coalescence layer may be doped with silicon to a concentration of, for example, about $10^{18}$ cm$^{-3}$.

An optional high-temperature (standard) GaN layer may be grown on the coalescence layer, if present, or on the defect reduction layer. The standard GaN layer is grown at a temperature of about 950° C. to about 1200° C., typically about 1125° C. Ranges and typical values for the partial pressure ratios $NH_3$/TMG and $NH_3$/$H_2$ during growth of the standard GaN layer are tabulated in row (c) of table 1 below. These growth conditions are selected to promote a smooth growth surface morphology and a high growth rate. The standard GaN layer has a thickness of, for example, about 0.1 μm to about 10 μm, typically about 2 μm. The standard GaN layer may be either undoped or doped n-type with silicon to a concentration of, for example, about $10^{18}$ cm$^{-3}$ or higher.

The sequence of defect reduction layer, optional coalescence layer, and optional high temperature GaN layer may be repeated multiple times in to further reduce the defect density in device layers 42, 43, and 44.

TABLE 1

| | Partial Pressure Ratios for Growth | | | |
| | $NH_3$/TMG | | $NH_3$/$H_2$ | |
| Layer | Typical | Range | Typical | Range |
| a) Defect Reduction | 510 | 200-1500 | 0.13 | 0.1-0.3 |
| b) Coalescence | 2200 | 1000-4000* | 0.3 | ≧0.2, often 0.2-0.9 |
| c) Standard | 1680 | 800-4000* | 0.5 | ≧0.35, often 0.35-0.85 |

*Practical limitation due to slow growth rate.

In some embodiments, second growth region 47 includes a defect reduction layer similar to the defect reduction layer described above with reference to first growth region 41. The defect reduction layer of second growth region 47 improves the material quality, and may be used with or without an optional coalescence layer and an optional standard III-nitride layer. Ranges and typical values for the partial pressure ratios $NH_3$/TMG and $NH_3$/$H_2$ during growth of the defect reduction layer of second growth region 47, as well as optional coalescence layer and an optional standard GaN layer are tabulated in rows (a)-(c) of table 1 above.

In some embodiments, second growth region 47 includes a Si-dosed layer to improve the material quality. The Si-dosed layer may be a high-temperature GaN layer grown on first region 41 at a temperature of about 950° C. to about 1200° C., typically about 1160° C. Ranges and typical values for the partial pressure ratios $NH_3$/TMG and $NH_3$/$H_2$ during growth of such a Si-dosed GaN layer may be substantially the same as those for the standard GaN layer or coalescence layer tabulated in rows (b) and (c) of the above table 1. These growth conditions are selected to promote a smooth growth surface morphology. The Si-dosed layer may be doped n-type with silicon to a concentration of, for example, about $10^{18}$ cm$^{-3}$ or higher.

A Si-dosed layer may be formed as follows: first a GaN layer is grown to a thickness of, for example, about 0.1 μm to about 10 μm, typically about 1 μm. The flow of TMG is then stopped and the GaN layer is exposed to $SiH_4$ or $Si_2H_6$ to deposit about 0.1 monolayers to about 3 monolayers, typically about one monolayer, of silicon onto the surface of the layer. The deposited silicon may react with nitrogen in layer 28 to form micro masks (islands) which cover portions of the surface of the layer. When III-nitride growth is subsequently reinitiated on the surface, III-nitride material nucleates on uncovered portions of the surface, grows vertically, and then grows laterally over the masks to form a low defect density layer. In some embodiments, the growth conditions and the amount of silicon delivered do not create micro masks, but are sufficient to result in rough growth similar to defect reduction layer in first region 41.

An optional coalescence layer may be grown over the Si-dosing masks under conditions substantially similar to those described above. A sequence including a Si-dosed GaN layer and optional coalescence layer may be repeated multiple times over first growth region 41 to further reduce the defect density in device regions 42, 43, and 44.

Although in the above examples the layers in second growth region 47 are formed from GaN, in other implementations these layers may be formed from other III-nitride materials such as, for example, InGaN, AlGaN, AlInGaN, AlInGaNAs, AlInGaNP, or combinations thereof. Defect reduction structures similar to the examples described above are described in S. Tanaka et al., Japanese Journal of Applied Physics 39, L831 (2000), incorporated herein by reference in its entirety. Micro masking techniques such as used in the above embodiment may be referred to as "silicon dosing" or anti-surfactant methods in the art.

In some embodiments, second growth region 47 includes a nucleation layer to improve the material quality. A nucleation layer suitable for second growth region 47 is described above in reference to first growth region 41.

Figure 4:
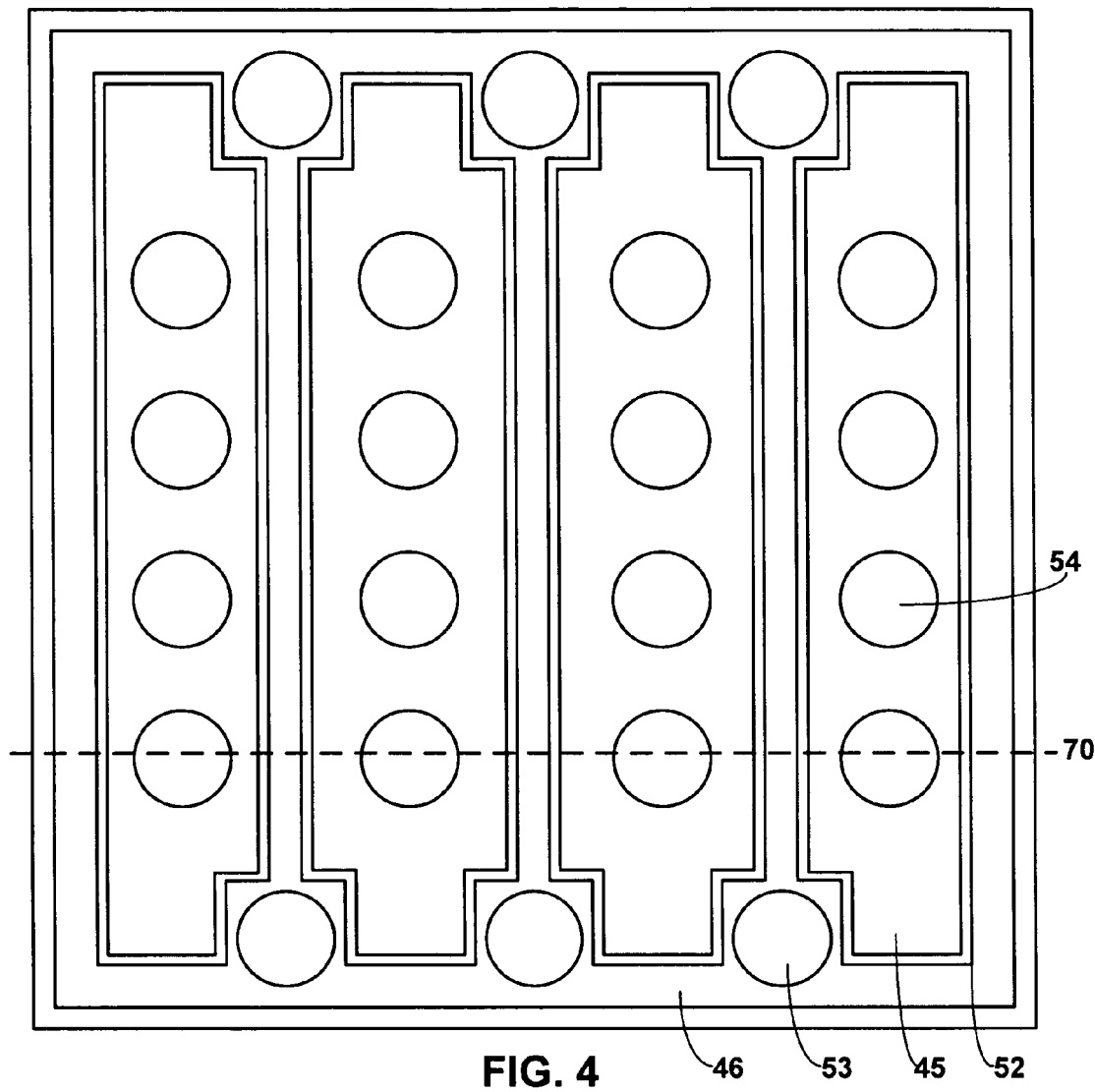
FIGS. 4 and 5 are a plan view and a cross sectional view of an arrangement of the contacts illustrated in FIG. 1.
Figure 5:
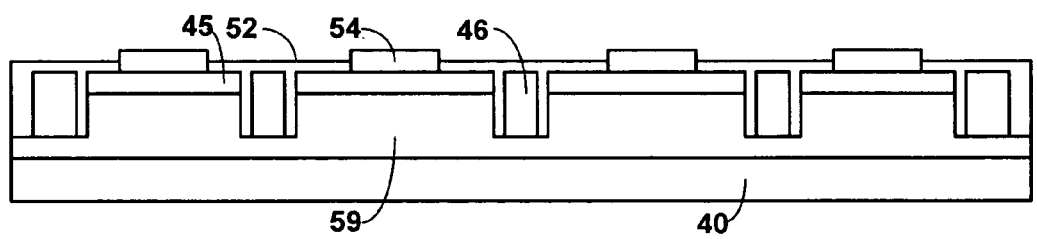
Figure 6:
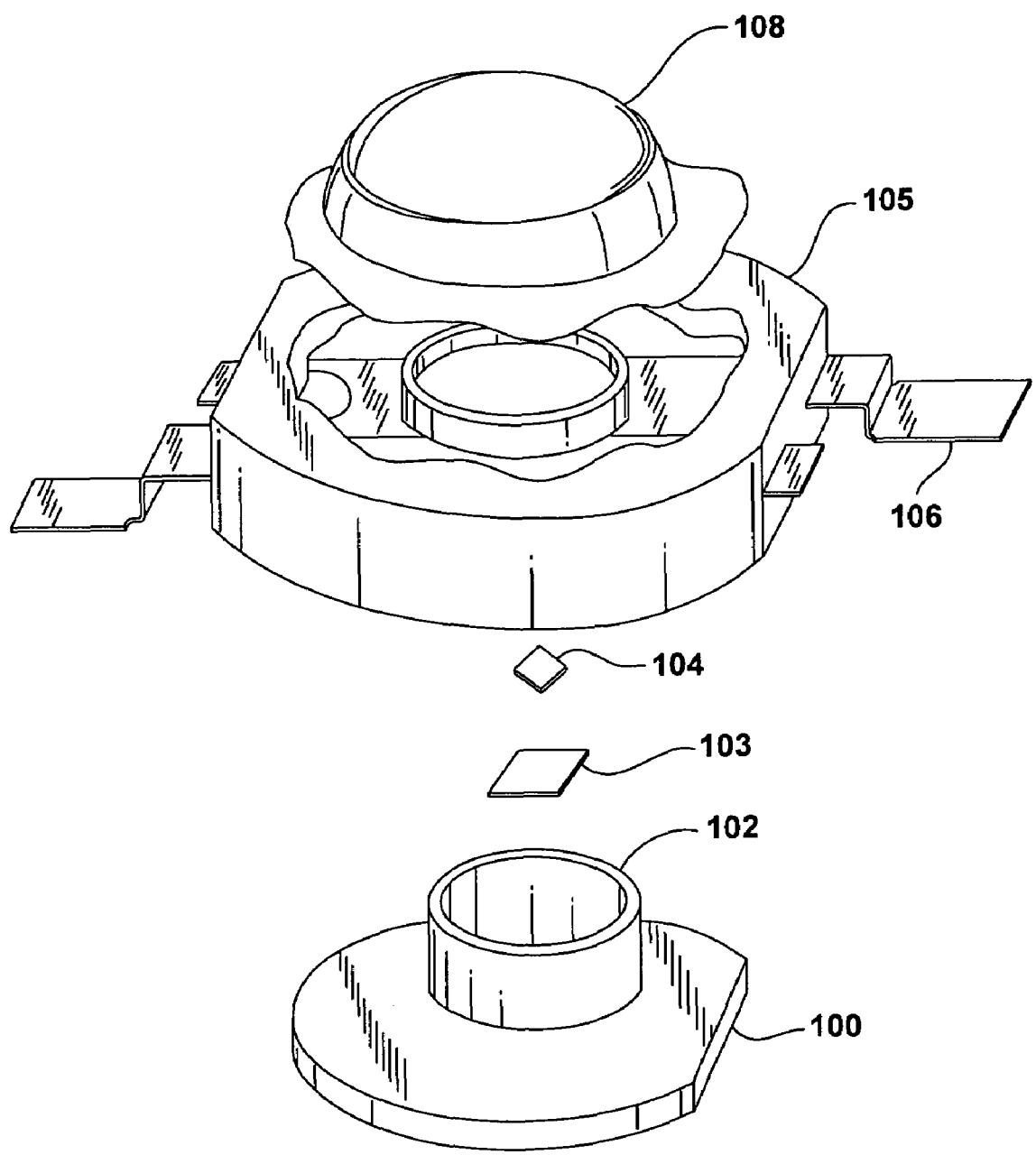
FIG. 6 is an exploded view of a packaged light emitting device.

FIG. 4 is a plan view of a large junction device (i.e. an area greater than or equal to one square millimeter). FIG. 5 is a cross section of the device shown in FIG. 4, taken along axis 70. FIGS. 4 and 5 illustrate an arrangement of contacts that may be used with any of the epitaxial structures illustrated and described in FIGS. 1-3 and accompanying text. Epitaxial structure 59 includes regions 41, 47, 42, 43, and 44 of FIG. 1. The active region of epitaxial structure 59 is separated into four regions separated by three trenches in which n-contacts 46 are formed. Each region is connected to a submount by four p-submount connections 54 formed on p-contact 45. N-contact 46 surrounds the four active regions. N-contact 46 is connected to a submount by six n-submount connections 53. The n- and p-contacts may be electrically isolated by an insulating layer 52.

FIG. 8 is an exploded view of a packaged light emitting device. A heat-sinking slug 100 is placed into an insert-molded lead frame 106. The insert-molded lead frame 106 is, for example, a filled plastic material molded around a metal frame that provides an electrical path. Slug 100 may include an optional reflector cup 102. The light emitting device die 104, which may be any of the devices described above, is mounted directly or indirectly via a thermally conducting submount 103 to slug 100. A cover 108, which may be an optical lens, may be added.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A structure comprising:
    a textured substrate, wherein:
        a textured surface of the substrate is a non-III-nitride surface;
        the texture on the substrate comprises a pattern of repeating features;
        the features have a length of at least 1 micron; and
        the features have a height between 0.1 micron and 1 micron;
    a first III-nitride region formed directly on the textured surface of the substrate, the first III-nitride region being substantially free of voids and having a defect density greater than $10^9$ cm$^{-2}$;
    a second III-nitride region disposed on the first III-nitride region, the second III-nitride region having an average defect density less than the first III-nitride region; and
    a light emitting region disposed between an n-type region and a p-type region, the light emitting region overlying the second III-nitride region;
    wherein the first III-nitride region comprising: a defect reduction layer and a coalescence layer; and
    wherein a surface of the coalescence layer is smoother than a surface of the defect reduction layer.

2. The structure of claim 1 wherein the first III-nitride region has a thickness between 0.5 micron and 10 microns.

3. The structure of claim 1
    the defect reduction layer of the first III-nitride region having a thickness between 0.1 micron and 15 microns; and
    the coalescence layer of the first III-nitride region having thickness between 0.4 micron and 20 microns.

4. The structure of claim 3 wherein:
    the defect reduction layer has a thickness between 0.5 micron and 1 micron; and
    the coalescence layer has a thickness between 0.5 micron and 1.5 microns.

5. The structure of claim 1 wherein the second III-nitride region comprises a silicon-dosed region.

6. The structure of claim 5 wherein the silicon-dosed region comprises:
    a GaN layer having a thickness between 0.1 micron and 1 micron; and
    a silicon layer having a thickness between 0.1 monolayers and 3 monolayers.

7. The structure of claim 1 wherein the second III-nitride region comprises:
    a defect reduction layer having a thickness between 0.1 micron and 15 microns; and
    a coalescence layer having a thickness between 0.4 micron and 20 microns;
    wherein a surface of the coalescence layer is smoother than a surface of the defect reduction layer.

8. The structure of claim 7 wherein:
    the defect reduction layer has a thickness between 0.5 micron and 1 micron; and
    the coalescence layer has a thickness between 0.5 micron and 1.5 microns.

9. The structure of claim 1 further comprising:
    an n-contact electrically connected to the n-type region; and
    a p-contact electrically connected to the p-type region.

10. The structure of claim 9 further comprising:
    leads electrically connected to the n- and p-contacts; and
    a cover disposed over the light emitting region.

11. The structure of claim 1 wherein the pattern has a cross section comprising a peak and a valley.

12. The structure of claim 1 wherein the features are spaced at least 1 micron apart.

13. A structure comprising:
    a textured substrate, wherein:
        a textured surface of the substrate is a non-III-nitride surface;
        the texture on the substrate comprises a pattern of repeating features;
        the features have a length of at least 1 micron; and
        the features have a height between 0.1 micron and 1 micron;
    a first III-nitride region formed directly on the textured surface of the substrate, the first III-nitride region being substantially free of voids and having a defect density greater than $10^9$ cm$^{-2}$, the first III-nitride region comprising a first portion adjacent to the substrate and a second portion, wherein the second portion has an RMS roughness less than an RMS roughness of the first portion;
    a second III-nitride region disposed on the first III-nitride region, the second III-nitride region comprising a first portion adjacent to the first III-nitride region and a second portion, wherein the second portion has an RMS roughness less than an RMS roughness of the first portion; and a light emitting region disposed between an n-type region and a p-type region, the light emitting region overlying the second III-nitride region;

wherein the first portion of the first III-nitride region comprises: a defect reduction layer and the second portion of the first III-nitride region comprises: a coalescence layer.

14. The structure of claim 13 wherein:

the first portion of the first III-nitride region has an RMS roughness between 50 nm and 175 nm; and the second portion of the first III-nitride region has an RMS roughness less than 20 nm.

15. The structure of claim 13 wherein:

the first portion of the second III-nitride region has an RMS roughness between 50 nm and 175 nm; and the second portion of the second III-nitride region has an RMS roughness less than 20 nm.

16. The structure of claim 13 wherein the first portion of the second III-nitride region comprises a silicon-dosed region.

17. The structure of claim 16 wherein the silicon-dosed region comprises:

a GaN layer having a thickness between 0.1 micron and 1 micron; and a silicon layer having a thickness between 0.1 monolayers and 3 monolayers.

18. The structure of claim 13 wherein:

the first portion of the first region comprises a defect reduction layer having a thickness between 0.1 micron and 15 microns; and the second portion of the first region comprises a coalescence layer having a thickness between 0.4 micron and 20 microns;

wherein a surface of the coalescence layer is smoother than a surface of the defect reduction layer.

19. The structure of claim 18 wherein:

the defect reduction layer has a thickness between 0.5 micron and 1 micron; and the coalescence layer has a thickness between 0.5 micron and 1.5 microns.

20. The structure of claim 13 further comprising:

an n-contact electrically connected to the n-type region;

a p-contact electrically connected to the p-type region.

21. The structure of claim 20 further comprising:

leads electrically connected to the n- and p-contacts; and a cover disposed over the light emitting region.

22. The structure of claim 1 wherein the substrate is a non-III-nitride material.

23. The structure of claim 1 wherein the substrate is one of sapphire and SiC.

24. The structure of claim 13 wherein the substrate is a non-III-nitride material.

25. The structure of claim 13 wherein the substrate is one of sapphire and SiC.

* * * * *